(12) United States Patent
Karaki

(10) Patent No.: US 8,500,505 B2
(45) Date of Patent: Aug. 6, 2013

(54) METHOD OF MANUFACTURING AN ORGANIC ELECTROLUMINESCENCE DISPLAY DEVICE

(75) Inventor: Tetsuya Karaki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 111 days.

(21) Appl. No.: 13/197,048

(22) Filed: Aug. 3, 2011

(65) Prior Publication Data

US 2012/0045958 A1 Feb. 23, 2012

(30) Foreign Application Priority Data

Aug. 17, 2010 (JP) .................................. 2010-182075
Jul. 12, 2011 (JP) .................................. 2011-153633

(51) Int. Cl.
*H01J 9/00* (2006.01)
(52) U.S. Cl.
USPC .............................................. 445/24; 445/25
(58) Field of Classification Search
USPC .............................. 445/24–25; 313/498–512
See application file for complete search history.

(56) References Cited

U.S. PATENT DOCUMENTS

| | | | |
|---|---|---|---|
| 6,453,913 B2 | 9/2002 | Katagiri et al. | |
| 6,946,783 B2 | 9/2005 | Kim | |
| 2003/0193285 A1 | 10/2003 | Kim | |
| 2004/0232829 A1* | 11/2004 | Ohshita et al. | 313/504 |
| 2010/0026173 A1* | 2/2010 | Lhee et al. | 313/504 |
| 2010/0096988 A1* | 4/2010 | Kitabayashi et al. | 315/51 |
| 2011/0239941 A1 | 10/2011 | Nakagawa et al. | |

FOREIGN PATENT DOCUMENTS

| | | |
|---|---|---|
| CN | 1476278 A | 2/2004 |
| EP | 1 353 379 A2 | 10/2003 |
| JP | 2003-332059 | 11/2003 |
| JP | 2007-234678 | 9/2007 |
| JP | 4173722 | 10/2008 |

OTHER PUBLICATIONS

Office Action in Chinese Application No. 201110230279.9, issued May 27, 2013, with English translation (11 pages).

* cited by examiner

*Primary Examiner* — Anne Hines
(74) *Attorney, Agent, or Firm* — Fitzpatrick, Cella, Harper & Scinto

(57) ABSTRACT

Provided is a film formation mask capable of preventing slit-like openings from being closed by vibrations so as to form a highly precise patterned film with stability. In a film formation mask formed by providing multiple slit-like openings in a metal foil, the shape of the opening of at least one end of the slit-like openings is asymmetrical with respect to a center line of the width direction of the slit-like openings.

1 Claim, 7 Drawing Sheets

METHOD OF MANUFACTURING AN ORGANIC ELECTROLUMINESCENCE DISPLAY DEVICE

BACKGROUND OF THE INVENTION

1. Field of the Invention

The present invention relates to a film formation mask for highly precise pattering, in which slit-like openings are provided in a metal foil, and more particularly, to a film formation mask for use in a vapor deposition process of an organic material in manufacturing an organic electroluminescence display device.

2. Description of the Related Art

In manufacturing an organic electroluminescence (EL) display device, as a process of forming an organic compound layer, there is known a method of forming a pattern of an organic material by using a film formation mask in which openings are provided in a metal foil. In this method, a thin film is formed by causing a vapor deposition material which has passed through the openings in the film formation mask to reach a substrate. This method is widely used, because a pattern of an organic film may be formed without using lithography. In recent years, a more and more finer pixel pattern is required. Thus, as the film formation mask, a tension mask is widely used, in which a thin metal foil having a highly precise opening pattern formed therein is attached to a frame. In particular, a slit-like opening pattern is widely used from the viewpoint of the ratio of area of openings in the mask and openings in a pixel.

For example, Japanese Patent No. 4,173,722 discloses a film formation mask having an ordinary slit-like opening pattern formed therein. In this film formation mask, the lengths, the shapes, and the pitches of the slit-like openings are uniform and the ends of the openings are aligned, and thus, the shapes and the positions of the metal foil between the openings are the same. Japanese Patent Application Laid-Open No. 2007-234678 discloses a film formation mask in which the ends of slit-like openings are gradually tapered toward the tips. Also in this case, the lengths, the shapes, and the pitches of the slit-like openings are uniform and the ends of the openings are aligned, and thus, the shapes and the positions of the metal foil between the openings are the same. Further, Japanese Patent Application Laid-Open No. 2003-332059 discloses a mask having bridges formed between openings. The ends of odd-numbered columns of openings and the ends of even-numbered columns of openings are staggered, and thus, the mask is less liable to be deformed by tension applied to the film formation mask and is highly precise, which improves the precision of the vapor deposition film.

A film formation mask having a fine opening pattern in which multiple slit-like openings are arranged has a problem that the sides of metal foil portions provided on both sides of the slit-like opening in a short side direction thereof are brought into contact with each other by vibrations. Such vibrations are caused when the film formation mask is brought into contact with a glass substrate or when the film formation mask is peeled off in a film formation process, or, when the mask is transferred. When such contact is caused, the slit-like openings are partly closed, and as a result, a problem arises that a film formation pattern in a desired shape cannot be formed. In particular, when the amount of an organic material deposited on the film formation mask increases, the state in which the sides of the metal foil portions are in contact with each other is maintained by the organic material deposited on the mask, and hence the area of closed portions of the slit-like openings increases.

Further, in the film formation mask disclosed in Japanese Patent Application Laid-Open No. 2003-332059, vibrations of the metal foil portions are scarcely caused by external vibrations because the bridges are formed, and thus, the above-mentioned problem that the slit-like openings are closed does not arise. However, the ratio of the area of the openings becomes smaller, and thus, the aperture ratio of a pixel becomes smaller with respect to the mask. When light is emitted with the same luminance, an increase in power consumption or a decrease in life is caused.

SUMMARY OF THE INVENTION

Accordingly, it is an object of the present invention to solve the above-mentioned problems and to provide a film formation mask having multiple slit-like openings formed therein, which is capable of preventing the slit-like openings from being closed by vibrations, so as to form a highly precise patterned film with stability.

According to the present invention, there is provided a film formation mask, including a metal foil fixed to a frame body with stronger tension applied to the metal foil in one direction than in another direction, in which:

the metal foil includes slit-like openings elongated in the one direction, which are repeatedly provided in a short side direction of the slit-like openings; and a shape of at least one end of each of the slit-like openings is asymmetrical with respect to a center line of a short side of the slit-like openings.

According to the present invention, the slit-like openings of the mask are prevented from being closed by vibrations. Therefore, by using the mask according to the present invention, a finely shaped pattern may be repeatedly obtained with high precision. In particular, in manufacturing an organic EL display device, a highly precise organic compound layer may be formed with high precision, and the yield and manufacturing efficiency may be improved.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

A film formation mask according to the present invention has, basically, similarly to a conventional mask, a structure in which a metal foil having multiple slit-like openings formed therein is fixed to a frame body under tension. The multiple slit-like openings provided in the metal foil are in a pattern in which openings having the same shape are repeatedly provided in parallel shift in a short side direction of the openings. The tension applied to the metal foil is stronger in a long side direction of the openings than in the short side direction of the openings. Conventionally, ends of the slit-like openings are symmetrical with respect to a center line of the short side of each of the openings, but, according to the present invention, ends of the slit-like openings are asymmetrical.

In the following, an embodiment of the film formation mask according to the present invention is described. It is to be noted that well-known or publicly known technologies in the art may be applied to parts which are not specifically illustrated or described herein. Further, the embodiment described in the following is merely an embodiment of the present invention, and the present invention is not limited thereto.

Figure 1A:
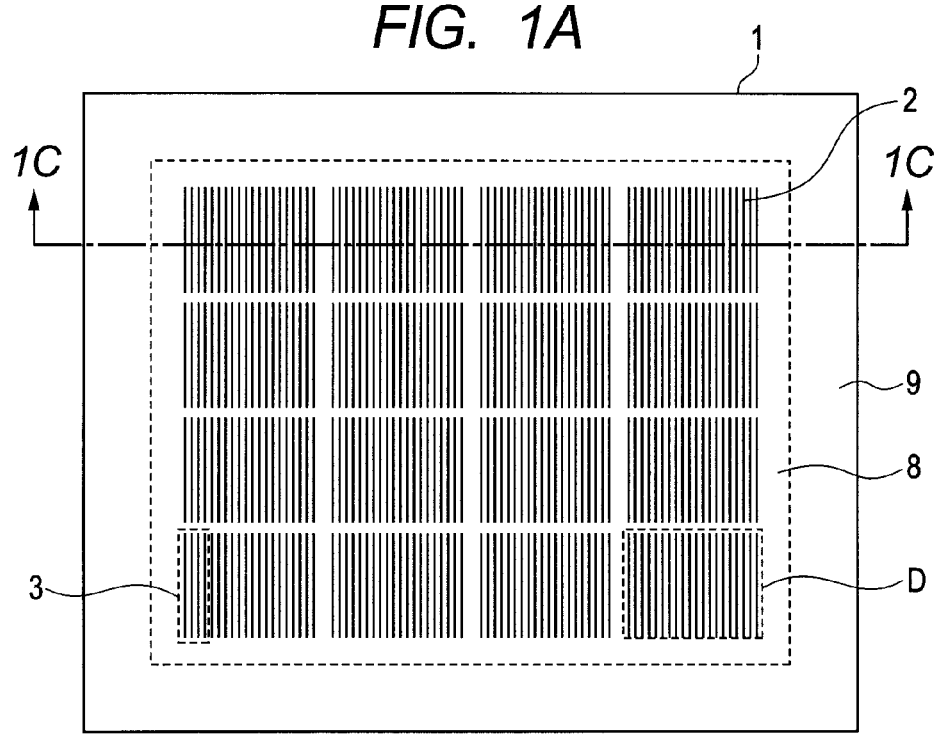
FIGS. 1A, 1B and 1C are an overall schematic view, a partially enlarged schematic view, and a sectional view, respectively, of a film formation mask according to an embodiment of the present invention.
Figure 1B:
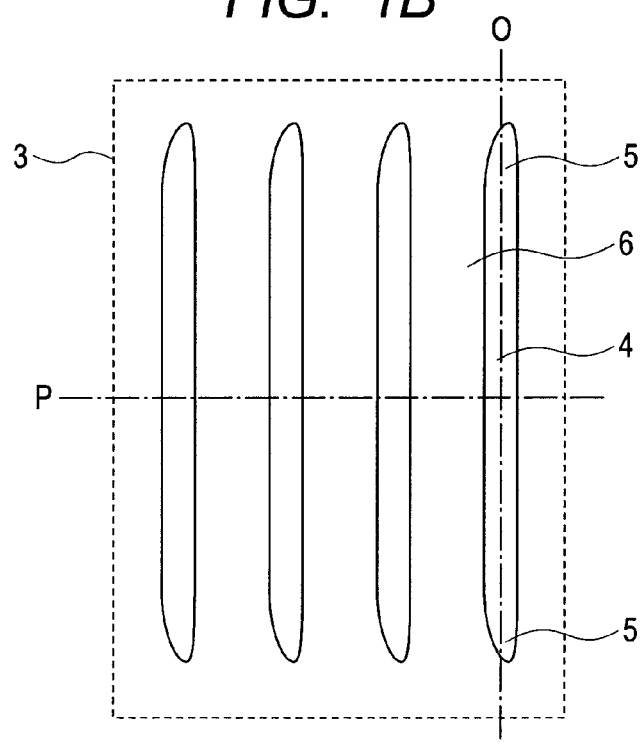
Figure 1C:
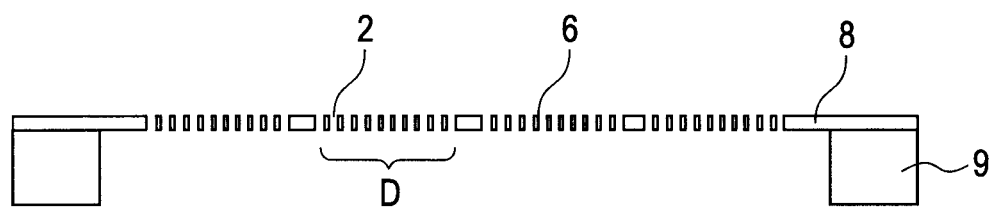
Figure 2:
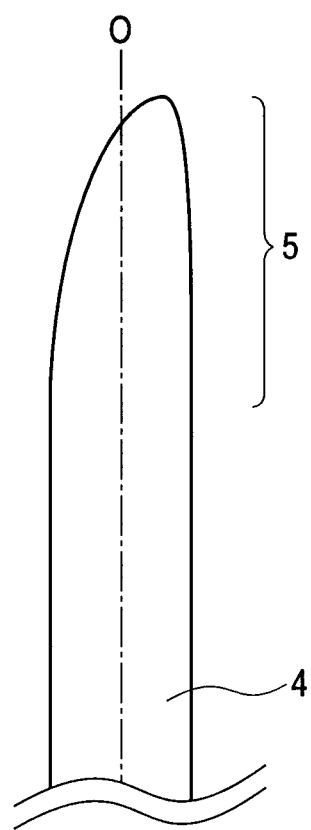
FIG. 2 is an enlarged schematic view of an end of a slit-like opening of the film formation mask illustrated in FIG. 1B.
Figure 3A:
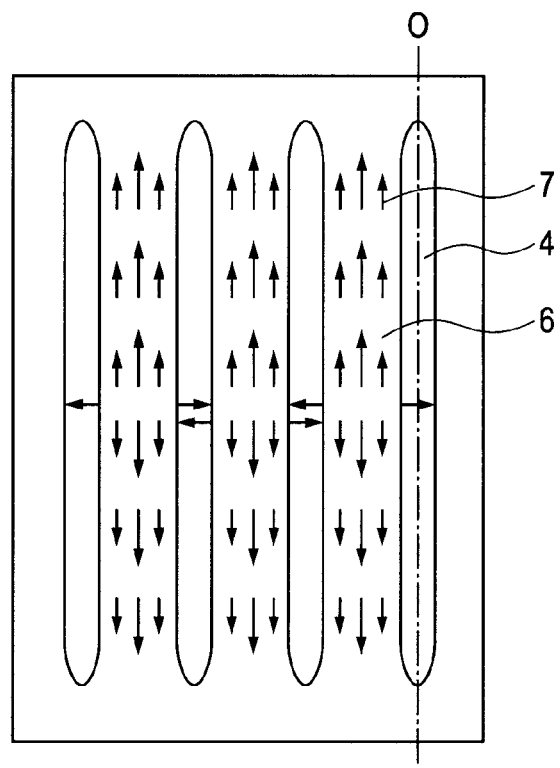
FIG. 3A is a schematic view illustrating movement of metal foil portions due to vibrations of a conventional film formation mask.
Figure 3B:
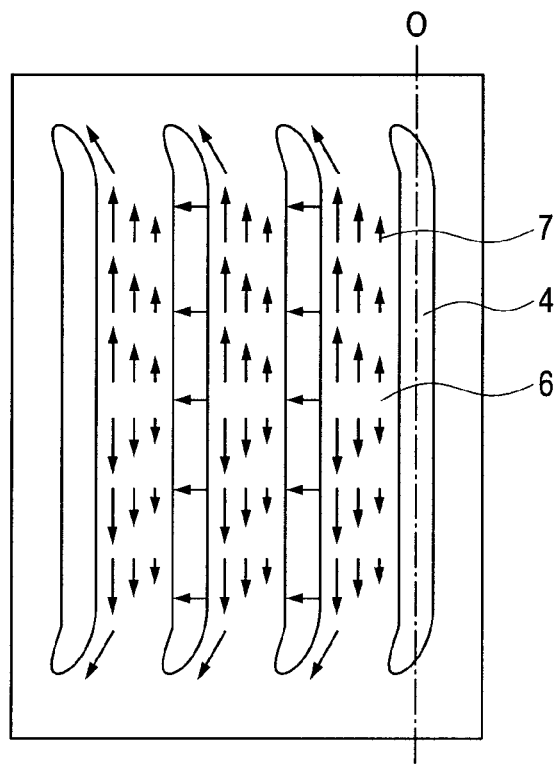
FIG. 3B is a schematic view illustrating movement of metal foil portions due to vibrations of the film formation mask according to the present invention.

FIGS. 1A to 1C illustrate an exemplary film formation mask according to the present invention. FIG. 1A is a plan view of the whole film formation mask, FIG. 1B is an enlarged schematic view of a region denoted as 3 of FIG. 1A, and FIG. 1C is a sectional view taken along the line 1C-1C of FIG. 1A. FIGS. 1A to 1C illustrate a film formation mask 1, patterned openings 2, slit-like openings 4, ends 5 of the slit-like openings, a metal foil portion 6, a metal foil 8, a frame body 9 for fixing the metal foil thereto, and a region D which corresponds to one display panel. In the present invention, the metal foil as a whole which is fixed to the frame body 9 is referred to as the metal foil 8, and a metal foil between the slit-like openings is referred to as the metal foil portion 6, so as to be distinguished from each other. The length of arrows in FIGS. 3A and 3B represents the magnitude of tension applied to the metal foil. FIG. 2 is an enlarged view of one end 5 of the slit-like opening 4 illustrated in FIG. 1B. According to the present invention, as illustrated in FIG. 2, the shape of the opening of at least one end 5 of the slit-like opening 4 is asymmetrical with respect to a center line O of the short side of the slit-like opening 4 (in a horizontal direction of the sheet of the drawings). It is preferred that, as illustrated in FIG. 2, the shapes of the openings of both ends 5 be asymmetrical with respect to the center line O of the short side, and in addition, as illustrated in FIG. 1B, be symmetrical with respect to a center line P of the long side of each of the slits. According to the present invention, the shape of the opening of the end 5 is made asymmetrical with respect to the center line O of the short side as illustrated in FIG. 2, to thereby prevent the slit-like opening 4 from being closed. The reason is described in the following.

Figure 7A:
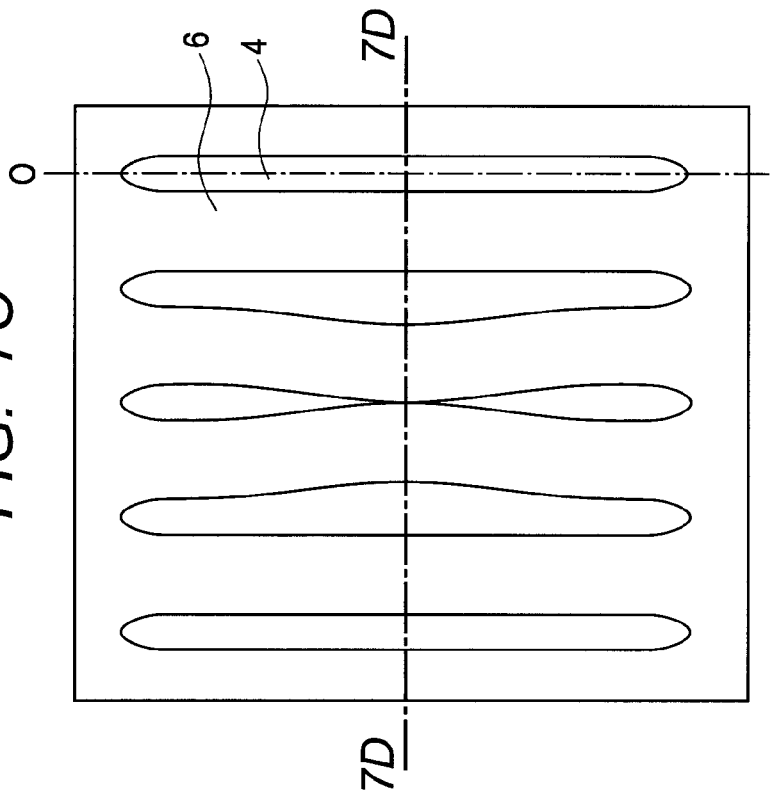
FIGS. 7A, 7B, 7C and 7D are explanatory diagrams of how a slit-like opening in a conventional film formation mask is closed.
Figure 7B:
Figure 7C:
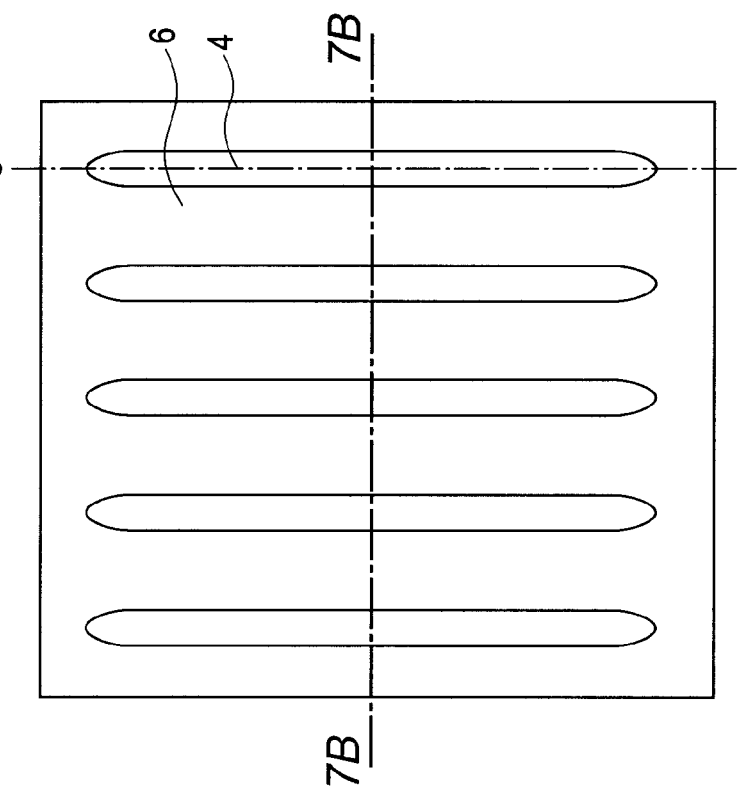
Figure 7D:

FIGS. 7A and 7C are plan views schematically illustrating a conventional film formation mask. FIG. 7B is a sectional view taken along the line 7B-7B of FIG. 7A, while FIG. 7D is a sectional view taken along the line 7D-7D of FIG. 7C. FIGS. 7A and 7B illustrate a state of the mask before film formation, and FIGS. 7C and 7D illustrate a state in which a slit-like opening 4 is closed. Also in the conventional mask, strong tension is applied to the metal foil portions 6 in the long side direction of the slit-like openings, but the metal foil portions 6 may vibrate to both sides in the short side direction of the slit-like openings 4 (to the right and to the left in the sheet of the drawings). Therefore, when a metal foil portion 6 vibrates with an amplitude of at least half the short side of the slit-like opening 4, as illustrated in FIGS. 7C and 7D, the sides of the metal foil portions 6 provided on both sides of the slit-like opening 4 may be brought into contact with each other to partially close the slit-like opening 4.

Next, tension (stress) applied to the metal foil portion 6 when vibrations are caused is described with reference to FIGS. 3A and 3B. FIG. 3A is a schematic plan view partially illustrating the metal foil 8 including multiple openings in the conventional film formation mask, which is also illustrated in FIGS. 7A to 7D, and FIG. 3B is a schematic plan view partially illustrating the metal foil 8 including multiple openings in the film formation mask according to the present invention. In the conventional film formation mask, the shape of the ends of the slit-like openings 4 is symmetrical with respect to the center line O of the short side. Therefore, as illustrated in FIG. 3A, stress 7 is uniformly applied to the metal foil portions 6 sandwiched between adjacent slit-like openings 4 both in the long side direction and in the short side direction of the slit-like openings 4. Therefore, the metal foil portion 6 uniformly vibrates in the width direction of the slit-like openings 4 (to the right and to the left in the sheet of the drawings). On this occasion, when adjacent metal foil portions 6 vibrate with an amplitude of ½ of the width of the openings of the slit-like openings 4, the sides of the metal foil portions 6 provided on both sides of the slit-like opening 4 are brought into contact with each other, as described with reference to FIGS. 7C and 7D.

When the shapes of the ends of the slit-like openings 4 are asymmetrical with respect to the center line O of the short side, as illustrated in FIG. 3B, the stress 7 applied to the metal foil portions 6 sandwiched between adjacent slit-like openings 4 is one-sided in the short side direction, and the direction of the vibrations of the metal foil portions 6 is limited to one side. Therefore, even when vibrations with an amplitude of ½ of the width of the openings of the slit-like openings 4 are caused, the metal foil portions 6 provided on both sides of the slit-like opening 4 vibrate always in the same direction, and thus, the sides of the metal foil portions 6 are not brought into contact with each other. Therefore, the slit-like openings 4 are prevented from being closed.

The film formation mask according to the present invention is preferably used in manufacturing an organic electroluminescence (EL) display device. An organic EL display device has, between a pair of electrodes, multiple organic EL elements each including an organic compound layer. The film formation mask according to the present invention is used in vapor deposition of the organic compound layer. The organic compound layer includes at least an emission layer, and in addition, a hole injection layer, a hole transport layer, an electron transport layer, and an electron injection layer are appropriately used as necessary. It is to be noted that the film formation mask according to the present invention may be preferably used in a film formation process other than in manufacturing an organic EL display device.

Example 1

A multi film formation mask as illustrated in FIGS. 1A to 1C and FIG. 2 was manufactured, for forming an organic compound layer in sixteen VGA organic EL display devices at single film formation. Openings in the same shape were repeatedly formed in the metal foil of the film formation mask. The shapes of ends of the slit-like openings 4 were asymmetrical with respect to the center line O of the short side and symmetrical with respect to the center line P of the long side. The thickness of the metal foil 8 was 40 µm, the length of the short side of the slit-like openings 4 was 40 µm, the length of the long side thereof was 55 mm, and the pitches in the short side direction of the slit-like openings 4 (that is, the width of the metal foil portion 6) was 120 µm.

Figure 8:
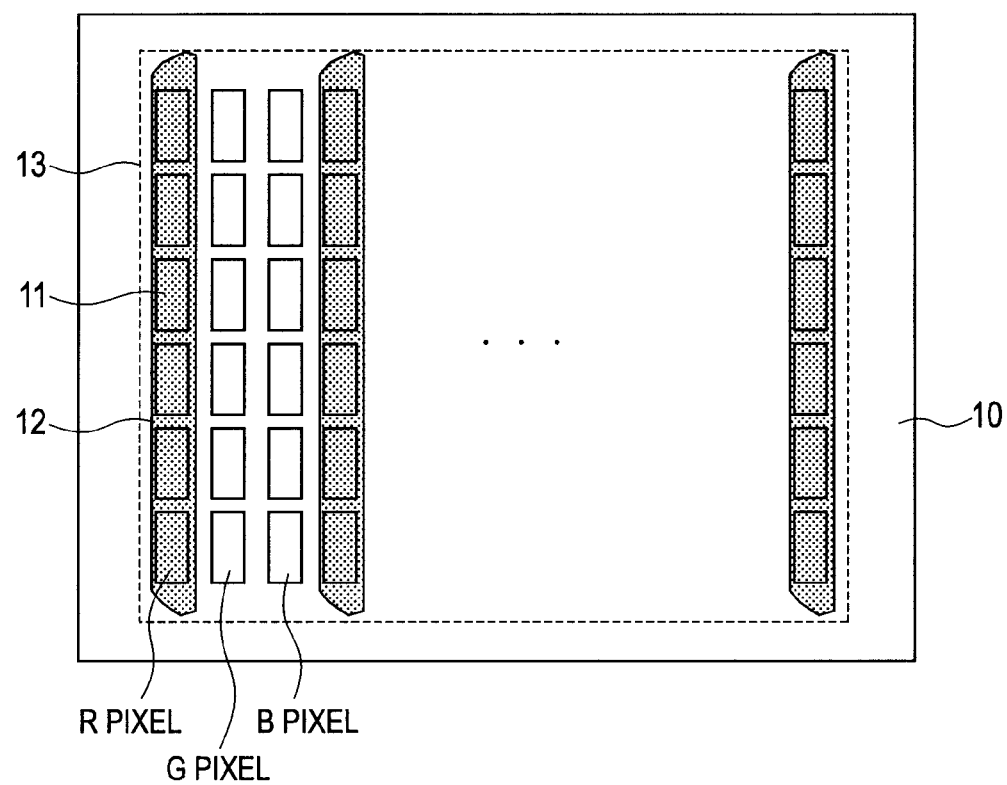
FIG. 8 is a schematic view illustrating an organic EL display device according to the present invention.

This mask was used to form an organic EL display device illustrated in FIG. 8. An organic compound layer of an organic EL element was formed on a circuit board 10 having circuits for driving the organic EL display device formed on a glass substrate. On the circuit board, first electrodes 11 each formed of a metal layer of 10 µm×60 µm were arranged so as to be 1,920×480 in a row direction and in a column direction, respectively, with 120 µm pitches both in the row direction and in the column direction for the respective organic EL elements for emitting red light (R), green light (G), and blue light (B).

After the openings in the film formation mask were aligned with the columns of the first electrodes, an emission layer 12 having a thickness of 40 nm as the organic compound layer was formed in multiple stripes. After the same film formation mask was used to form the film continuously on 100 circuit boards, the film formation mask was taken out of a film formation apparatus and observed. The observation showed no phenomenon that metal foil portions of the mask were brought into contact with each other to close the slit-like openings. A film formation mask having an opening for each organic EL display device was used to form a transparent conductive layer as a second electrode 13 on the circuit board on which the organic compound layer was formed. The second electrode was formed as a film which communicated with the multiple organic EL elements. After that, a sealing layer having silicon nitride as a main component which communicated with the sixteen organic EL display devices was formed without using a mask, and then, the circuit board was cut into pieces to obtain sixteen organic EL display devices from one substrate. Among the obtained organic EL display devices, 40 organic EL display devices were randomly sampled and the film formation pattern was observed. There were no traces of the phenomenon that metal foil portions of the mask were brought into contact with each other to close the slit-like openings.

Example 2

Figure 4:
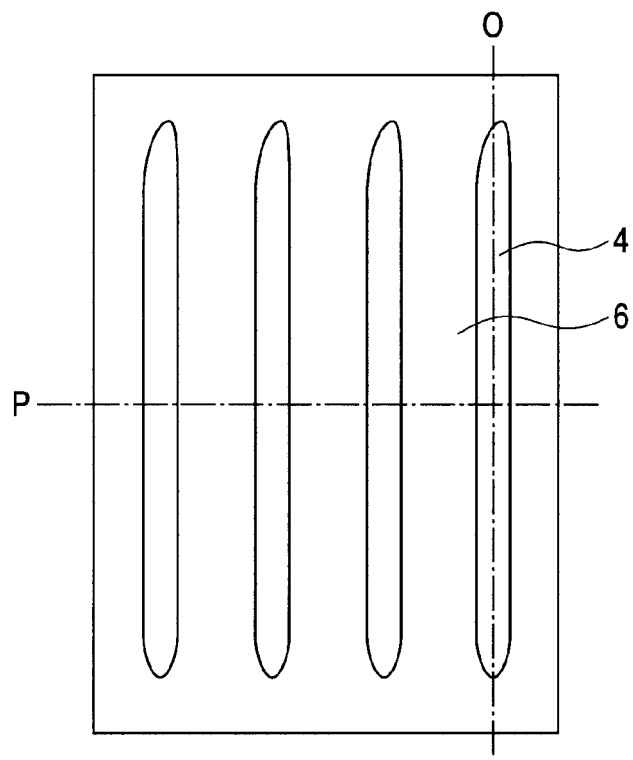
FIG. 4 is a schematic view illustrating a shape of the slit-like openings of the film formation mask of an example according to the present invention.

As illustrated in FIG. 4, a mask was manufactured similarly to the case of Example 1 except that the shape of one end of each of the openings was asymmetrical with respect to the center line O of the short side and the shape of the other end of each of the openings was symmetrical with respect to the center line O of the short side (in other words, each of the openings was asymmetrical with respect the center line P of the long side).

This mask was used to form an organic compound layer of an organic EL element similarly to the case of Example 1. After the same film formation mask was used to form the film at a thickness of 40 nm continuously on 100 circuit boards, the film formation mask was taken out of the film formation apparatus and the openings were observed. The observation showed no phenomenon that metal foil portions of the mask were brought into contact with each other to close the slit-like openings. Further, similarly to the case of Example 1, the film formation pattern was observed. There were no traces of the phenomenon that metal foil portions of the mask were brought into contact with each other to close the slit-like openings.

Example 3

Figure 5:
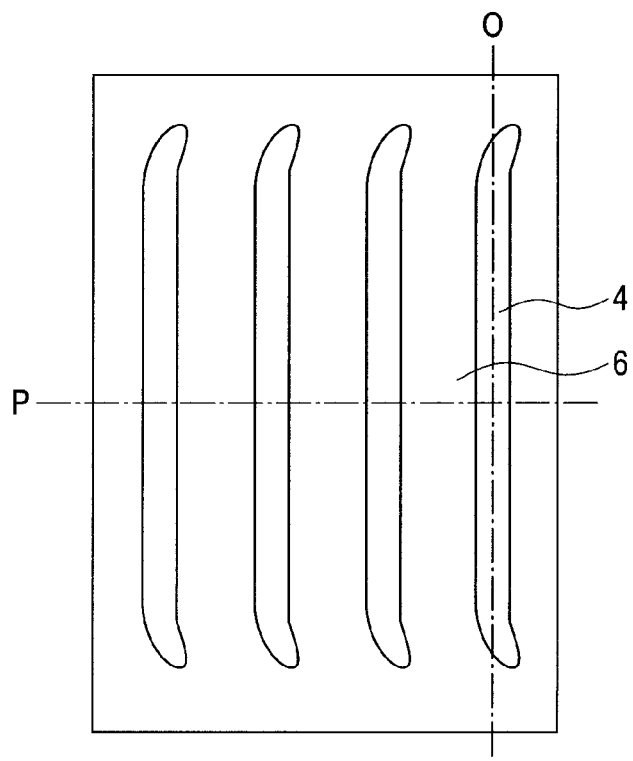
FIG. 5 is a schematic view illustrating a shape of the slit-like openings of the film formation mask of another example according to the present invention.

As illustrated in FIG. 5, a film formation mask was manufactured similarly to the case of Example 1 except that in the slit-like openings 4, the shapes of the ends of each of the openings were asymmetrical with respect to the center line O of the short side and symmetrical with respect to the center line P of the long side.

This film formation mask was used to form an organic compound layer of an organic EL element on a glass substrate. After the film formation mask was used to form the film at a thickness of 40 nm continuously on 100 circuit boards, the film formation mask was taken out of the film formation apparatus and the film formation mask was observed. The observation showed no phenomenon that metal foil portions of the mask were brought into contact with each other to close the slit-like openings. Further, the film formation pattern on the glass substrate was observed. There were no traces of the phenomenon that metal foil portions of the mask were brought into contact with each other to close the slit-like openings.

Comparative Example

Figure 6:
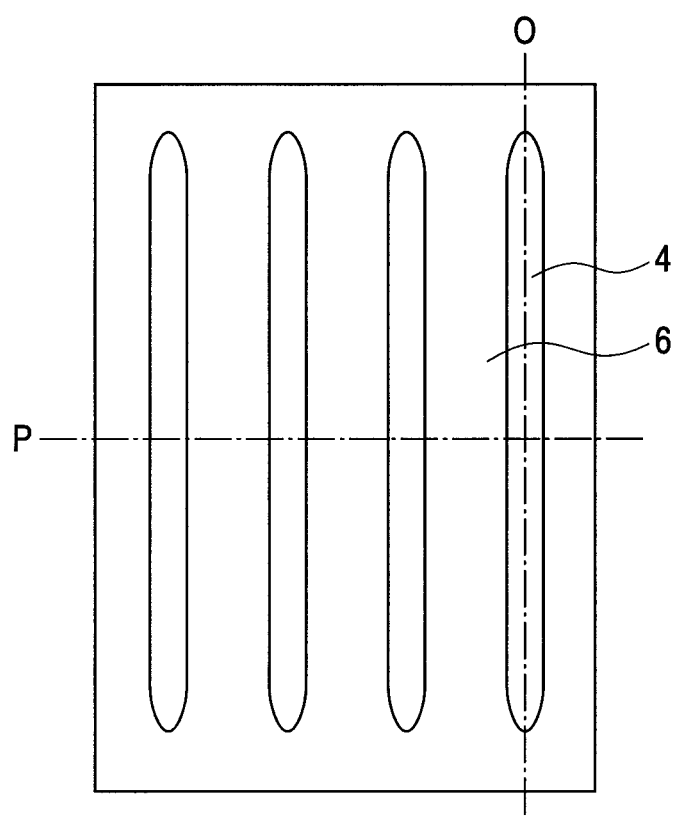
FIG. 6 is a schematic view illustrating a shape of the slit-like openings of the film formation mask of a comparative example of the present invention.

As illustrated in FIG. 6, a film formation mask was manufactured similarly to the case of Example 1 except that in the slit-like openings 4, the shapes of the ends of each of the openings were symmetrical with respect to the center line O of the short side and symmetrical with respect to the center line P of the long side.

This film formation mask was used to form an organic compound layer of an organic EL element on a glass substrate. After the film formation mask was used to form the film at a thickness of 40 nm continuously on 100 circuit boards, the film formation mask was taken out of the film formation apparatus and the film formation mask was observed. The observation showed a phenomenon that metal foil portions of the mask were brought into contact with each other to close the slit-like openings. Further, the film formation pattern on the glass substrate was observed and traces of the phenomenon that metal foil portions of the mask were brought into contact with each other to close the slit-like openings were found. It was then confirmed that the film formation pattern was defective on the almost entire surface by the 50th circuit board.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-182075, filed Aug. 17, 2010 and Japanese Patent Application No. 2011-153633, filed Jul. 12, 2011 which are hereby incorporated by reference herein in their entirety.

What is claimed is:

1. A method of manufacturing an organic electroluminescence display device, comprising:
   forming multiple first electrodes on a substrate;
   forming an organic compound layer on the multiple first electrodes using a film formation mask; and forming a second electrode on the organic compound layer,
wherein the forming an organic compound layer includes
forming a film in multiple stripes, the film in the multiple stripes being in a pattern in which stripes are repeated in a direction of a short side, shapes of ends of the stripes being asymmetrical with respect to a center line of the short side.

\* \* \* \* \*